United States Patent
Garg et al.

(10) Patent No.: US 9,473,135 B2
(45) Date of Patent: Oct. 18, 2016

(54) DRIVER CIRCUIT INCLUDING DRIVER TRANSISTORS WITH CONTROLLED BODY BIASING

(71) Applicant: STMicroelectronics International N.V., Amsterdam (NL)

(72) Inventors: Paras Garg, Noida (IN); Rajesh Yadav, Greater Noida (IN); Saiyid Mohammad Irshad Rizvi, New Delhi (IN); Ravinder Kumar, Ambala (IN)

(73) Assignee: STMicroelectronics International N.V., Amsterdam (NL)

( * ) Notice: Subject to any disclaimer, the term of this patent is extended or adjusted under 35 U.S.C. 154(b) by 131 days.

(21) Appl. No.: 14/500,076

(22) Filed: Sep. 29, 2014

(65) Prior Publication Data

US 2016/0094217 A1   Mar. 31, 2016

(51) Int. Cl.
*H03K 3/00* (2006.01)
*H03K 17/687* (2006.01)
*H03K 19/0185* (2006.01)

(52) U.S. Cl.
CPC ........ *H03K 17/687* (2013.01); *H03K 19/0185* (2013.01); *H03K 2217/0018* (2013.01)

(58) Field of Classification Search
CPC .................................................. H03K 17/687
USPC ....................................................... 327/108
See application file for complete search history.

(56) References Cited

U.S. PATENT DOCUMENTS

| | | | | |
|---|---|---|---|---|
| 5,801,548 A * | 9/1998 | Lee | ................ | H03K 19/0027 326/33 |
| 7,990,196 B2 * | 8/2011 | Voegele | ........... | H03K 19/01858 327/108 |
| 8,207,760 B2 * | 6/2012 | Pham | ............... | H03K 17/04206 326/85 |
| 8,803,591 B1 * | 8/2014 | Roy | ................... | H03K 19/0027 327/534 |
| 9,054,578 B2 * | 6/2015 | Hsieh | ..................... | H02M 1/088 |
| 2002/0195623 A1 * | 12/2002 | Horiuchi | ............. | H01L 27/1203 257/200 |
| 2008/0034378 A1 * | 2/2008 | Kumar | ................ | G06F 13/4086 719/321 |
| 2010/0102872 A1 * | 4/2010 | Wu | ........................ | G05F 3/205 327/534 |
| 2010/0244905 A1 * | 9/2010 | Kim | ..................... | G11C 7/1084 327/108 |
| 2012/0206188 A1 * | 8/2012 | Duong | ................. | H03K 17/302 327/437 |
| 2014/0312423 A1 * | 10/2014 | Cheng | .............. | H01L 21/82380 257/351 |

OTHER PUBLICATIONS

De Streel et al: "Study of Back Biasing Schemes for ULV Logic from the Gate Level to the IP Level," J. Low Power Electron. Appl. 2014, 4, 168-187; doi:10.3390/jlpea4030168.

* cited by examiner

*Primary Examiner* — Ryan Jager
(74) *Attorney, Agent, or Firm* — Gardere Wynne Sewell LLP (57) ABSTRACT

A drive circuit includes a first drive transistor coupled between a first supply node and an output pad of an integrated circuit and a second drive transistor coupled between a second supply node and the output pad. The first drive transistor and second drive transistors are controlled by a control signal. A body bias generator circuit is configured to apply a variable first body bias to the first transistor and a variable second body bias to the second transistor. The variable first and second body biases are generated as a function of the control signal and a voltage at the output pad.

22 Claims, 6 Drawing Sheets

DRIVER CIRCUIT INCLUDING DRIVER TRANSISTORS WITH CONTROLLED BODY BIASING

TECHNICAL FIELD

This disclosure relates generally to a driver circuit, and more particularly to a driver circuit wherein control is exercised over the biasing of the body terminals of the drive transistors.

BACKGROUND

Figure 1A:
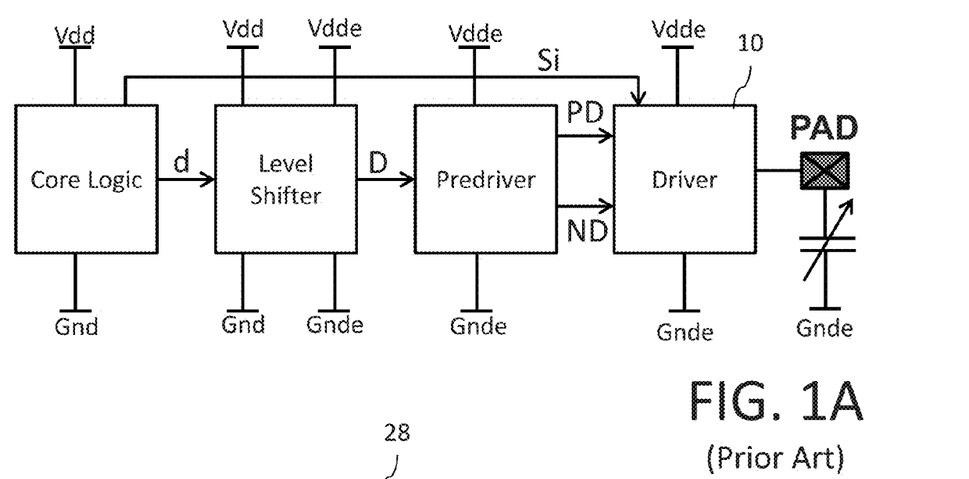
FIG. 1A is a block diagram of an integrated circuit.
Figure 1B:
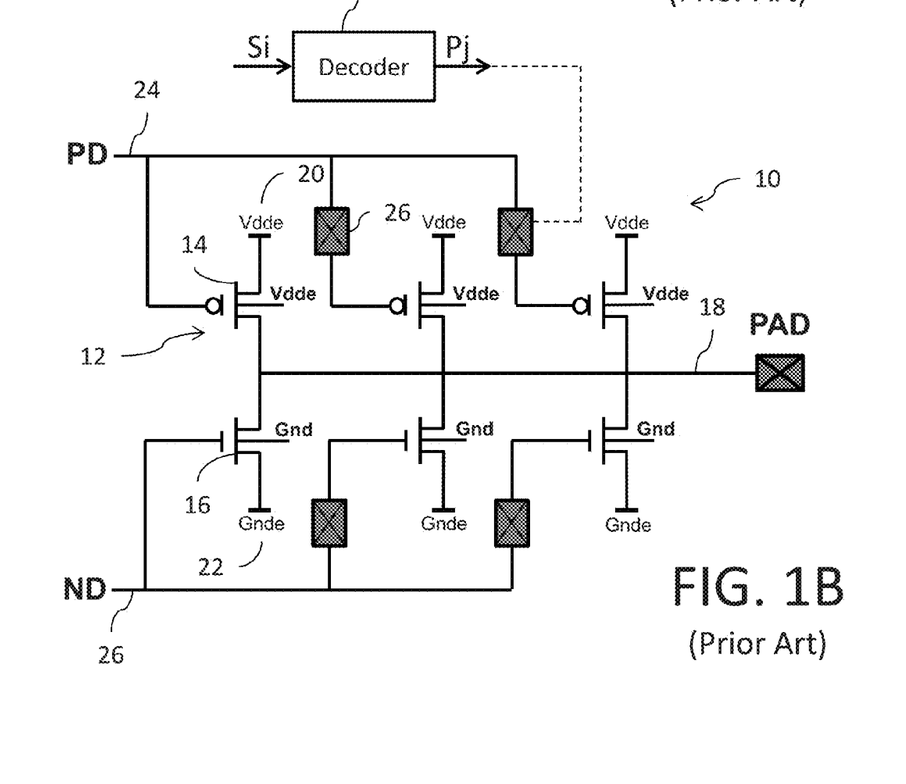
FIG. 1B is a circuit diagram of a prior art driver circuit for the integrated circuit of FIG. 1A.

Reference is now made to FIG. 1A showing a block diagram of an integrated circuit. The integrated circuit includes a core logic block configured to generate an output digital signal d. The core logic block is powered by a first power supply domain referenced to the supply voltages Vdd and Gnd. The digital signal d is received at the input of a level shifter circuit. The level shifter circuit converts the digital signal d from the first power supply domain to a second power supply domain and outputs a digital signal D. The second power supply domain is referenced to the supply voltages Vdde and Gnde. In an example, Vdde>Vdd and Gnde=Gnd. In such an example, Vdd=1.0V, Vdde=1.8V and Gnd=Gnde=0V. A predriver circuit receives the digital signal D and generates a p-MOS drive signal PD and an n-MOS drive signal ND from the signal D. The signals PD and ND have the same phase as the signal D but are slightly offset from signal D in the time domain. In an example, the predriver circuit may be implemented by buffer circuits in a manner known in the art. The predriver circuit is also powered from the second power supply domain. The signals PD and ND are applied to the inputs of a driver circuit 10 (the circuit details of which are shown in FIG. 1B, discussed below), with the driver circuit 10 generating an output signal applied to a pad (for example including a package pin) of the integrated circuit. The driver circuit 10 is also powered from the second power supply domain. The driver circuit is configurable with a variable drive strength selected by the core logic block through a configuration signal Si. The signal Si may, for example, be a multi-bit digital signal that is decoded by the driver circuit 10 to select the drive strength. A load, schematically illustrated here as a variable capacitance, is attached to the integrated circuit pad (pin) and is driven by the output signal.

Reference is now made to FIG. 1B showing a circuit diagram for the driver circuit 10.

The circuit 10 includes a plurality of half-bridge drive circuits 12 coupled in parallel. Each half-bridge drive circuit 12 comprises a p-channel MOSFET transistor 14 and an n-channel MOSFET transistor 16. The transistors 14 and 16 are formed as low threshold voltage (LVT) devices for high speed operation. The source-drain paths of the transistors 14 and 16 are coupled in series at an output node 18 (which is directly connected to the output pad). The source terminals of the transistors 14 are coupled to a first power supply node 20 of the second power supply domain. The source terminals of the transistors 16 are coupled to a second power supply node 22 of the second power supply domain. The power supply node 20 may, for example, be a positive power supply node (at supply voltage Vdde) and the power supply node 22 may, for example, be a ground power supply node (at supply voltage Gnde). The drain terminals of transistors 14 and 16 are coupled together at output node 18.

The driver circuit 10 is driven by the p-MOS drive signal PD and the n-MOS drive signal ND, where those signals are derived from the data signal D after buffering. The p-MOS drive signal PD is coupled to input line 24. The n-MOS drive signal ND is coupled to a second input line 26. The first input line 24 is coupled to the gate terminal of the transistor 14 in each half-bridge drive circuit 12. The second input line 26 is coupled to the gate terminal of the transistor 16 in each half-bridge drive circuit 12. Each of the transistors 14 and 16 includes, as known in the art, a body (or bulk) terminal. The body terminals of the transistors 14 and 16 are biased by the voltages at the first and second power supply nodes 20 and 22, respectively, for example by connecting the body terminal to the source terminal of each transistor.

The coupling of the gate terminals of the transistors in a first of the half-bridge drive circuits 12 to the lines 24 and 26, respectively, is a direct connection in an example implementation. The coupling of the gate terminals of the transistors in the other half-bridge drive circuits 12 to the lines 24 and 26, respectively, is an indirect connection made through a pass-gate circuit 26 (for example, formed of a single MOS transistor or a pair of parallel connected CMOS transistors). The pass gate circuits 26 are selectively actuated in response to the configuration signal Si to implement variable strength drive. A decoder circuit 28 receives and decodes the configuration signal Si to generate pass signals Pj for application to control selective actuation of each of the other half-bridge drive circuits 12 by selectively turning on the pass-gate circuit 26.

SUMMARY

In an embodiment, a circuit comprises: a first drive transistor coupled between a first supply node and an output pad, the first drive transistor having a first control terminal configured to receive a control signal, and further having a first body terminal; a second drive transistor coupled between a second supply node and said output pad, the second drive transistor having a second control terminal configured to receive said control signal, and further having a second body terminal; and a body bias generator circuit configured to apply a first body bias voltage to said first body terminal and a second body bias voltage to said second body terminal; wherein said first and second body bias voltages vary as a function of said control signal and a voltage at said output pad.

In an embodiment, a method comprises: driving a control terminal of a first transistor coupled to an output pad with a control signal; driving a control terminal of a second transistor coupled to said output pad with said control signal; applying a first body bias voltage to a first body terminal of said first transistor, wherein said first body bias voltage varies over time in response to said control signal and a voltage at said output pad; and applying a second body bias voltage to a second body terminal of said second transistor, wherein said second body bias voltage varies over time in response to said control signal and said voltage at said output pad.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF THE DRAWINGS

Figure 2A:
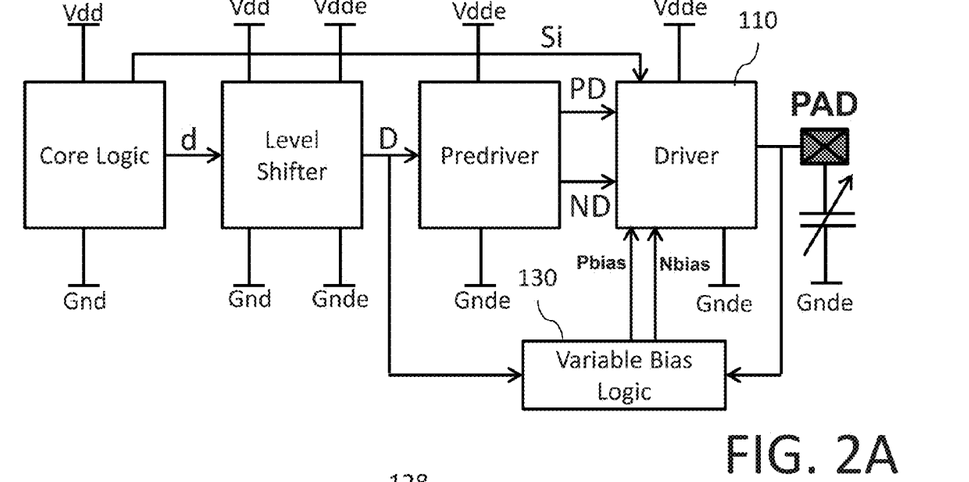
FIG. 2A is a block diagram of an integrated circuit.
Figure 2B:
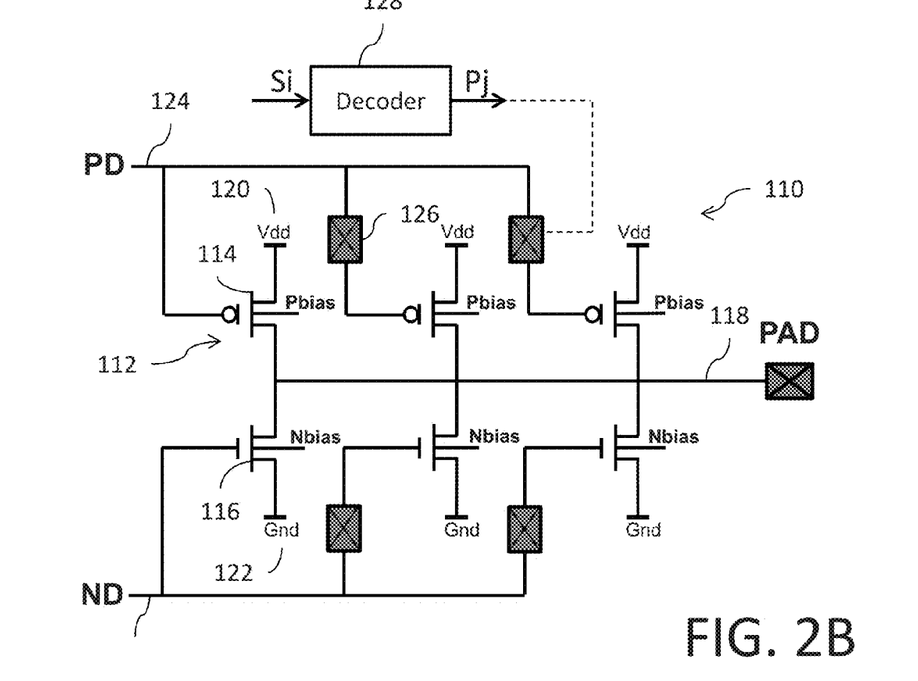
FIG. 2B is a circuit diagram of a driver circuit for the integrated circuit of FIG. 2A.

Reference is now made to FIG. 2A showing a block diagram of an integrated circuit. The integrated circuit includes a core logic block configured to generate an output digital signal d. The core logic block is powered by a first power supply domain referenced to the supply voltages Vdd and Gnd. The digital signal d is received at the input of a level shifter circuit. The level shifter circuit converts the digital signal d from the first power supply domain to a second power supply domain and outputs a digital signal D. The second power supply domain is referenced to the supply voltages Vdde and Gnde. In an example, Vdde>Vdd and Gnde=Gnd. In such an example, Vdd=1.0V, Vdde=1.8V and Gnd=Gnde=0V. A predriver circuit receives the digital signal D and generates a p-MOS drive signal PD and an n-MOS drive signal ND from the signal D. The signals PD and ND have the same phase as the signal D but are slightly offset from signal D in the time domain. In an example, the predriver circuit may be implemented by buffer circuits in a manner known in the art. The predriver circuit is also powered from the second power supply domain. The signals PD and ND are applied to the inputs of a driver circuit 110 (the circuit details of which are shown in FIG. 2B, discussed below), with the driver circuit 110 generating an output signal applied to a pad (for example including a package pin) of the integrated circuit. The driver circuit 110 is also powered from the second power supply domain. The driver circuit is configurable with a variable drive strength selected by the core logic block through a configuration signal Si. The signal Si may, for example, be a multi-bit digital signal that is decoded by the driver circuit 110 to select the drive strength. A load, schematically illustrated here as a variable capacitance, is attached to the pad and is driven by the output signal.

The integrated circuit further includes a variable bias logic circuit 130. The circuit 130 receives the data signal D as well as the voltage at the pad and is configured to generate a Pbias signal and an Nbias signal. The Pbias and Nbias signals are applied to bias the p-MOS and n-MOS transistors, respectively, within the driver circuit 110.

Reference is now made to FIG. 2B showing a circuit diagram for the driver circuit 110.

The circuit 110 includes a plurality of half-bridge drive circuits 112 coupled in parallel. Each half-bridge drive circuit 112 comprises a p-channel MOSFET transistor 114 and an n-channel MOSFET transistor 116. The illustration of three half-bridge drive circuits 112 is by example only, it being understood that the circuit could include more or less depending on application. The transistors 114 and 116 are formed as regular threshold voltage (RVT) devices or low threshold voltage (LVT) devices. The source-drain paths of the transistors 114 and 116 are coupled in series at an output node 118 (which may in an example implementation be directly connected to an output pad of the integrated circuit). The source terminals of the transistors 114 are coupled to a first power supply node 120 of the second power supply domain. The source terminals of the transistors 116 are coupled to a second power supply node 122 of the second power supply domain. The power supply node 120 may, for example, be a positive power supply node (Vdde) and the power supply node 122 may, for example, be a ground power supply node (Gnde). The drain terminals of transistors 114 and 116 are coupled together at output node 118.

The driver circuit 110 is driven by the p-MOS drive signal PD and the n-MOS drive signal ND, where those signals are derived from the data signal D after buffering. The p-MOS drive signal PD is coupled to input line 124. The n-MOS drive signal ND is coupled to a second input line 126. The first input line 124 is coupled to the gate terminal of the transistor 114 in each half-bridge drive circuit 112. The second input line 126 is coupled to the gate terminal of the transistor 116 in each half-bridge drive circuit 112.

Each of the transistors 114 and 116 includes, as known in the art, a body (or bulk) terminal. The body terminals of the transistors 114 are biased by a first variable bias voltage Pbias and the transistors 116 are biased by a second variable bias voltage Nbias. The bias voltages Pbias and Nbias are generated by the variable bias logic circuit 130 in response to the data signal D and the voltage at the pad.

Figure 8:
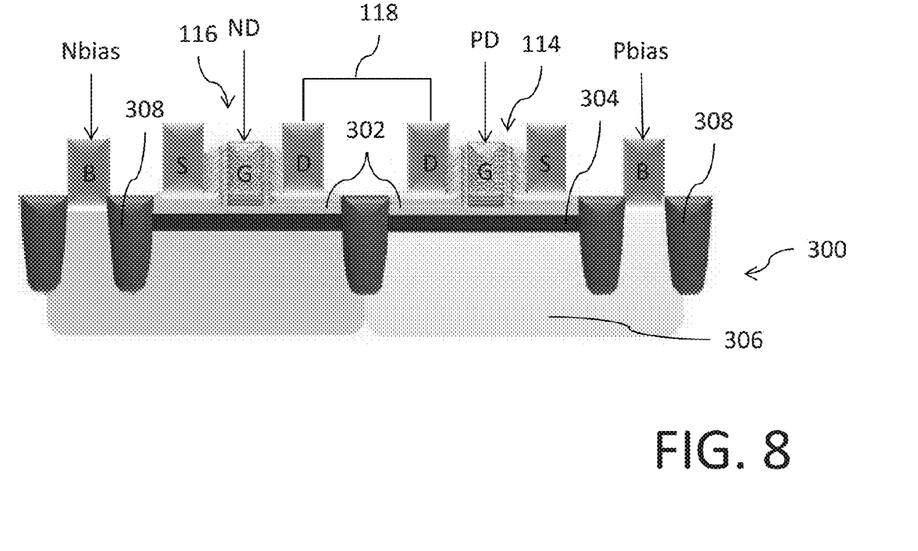
FIG. 8 is a cross-sectional illustration of a CMOS transistor configuration implemented in a fully-depleted silicon on insulator (FD-SOI) substrate supporting controllable body terminals.

In an example implementation, the transistors 114 and 116 are implemented as shown in FIG. 8 using a fully-depleted silicon on insulator (FD-SOI) substrate 300 with a silicon layer 302 supporting source (S) and drain (D) regions, an insulating layer 304 and a silicon support substrate 306 for the body (B) regions. In particular, the substrate may be of the ultra-thin body and buried oxide (UTBB) type. The transistors are insulated from each other using trench isolation structures 308. The gate (G) is insulated from the silicon layer 302 by a gate dielectric. Separate contacts are provided for the gate, source, drain and body regions of the transistors. This structure, in particular, permits the application of the Pbias and Nbias voltages to the body terminals of the transistors 114 and 116.

The coupling of the gate terminals of the transistors in a first of the half-bridge drive circuits 112 to the lines 124 and 126, respectively, is a direct connection. The coupling of the gate terminals of the transistors in the other half-bridge drive circuits 112 to the lines 124 and 126, respectively, is an indirect connection made through a pass-gate circuit 126 (for example, formed of a single MOS transistor or a pair of parallel connected CMOS transistors). The pass gate circuits 126 are selectively actuated in response to the configuration signal Si to implement variable strength drive. A decoder circuit 128 receives and decodes the configuration signal Si to generate pass signals Pj for application to control selective actuation of each of the other half-bridge drive circuits 112 by selectively turning on the pass-gate circuit 126.

The variable bias logic circuit 130 comprises a first bias generator circuit 140 configured to generate the first variable bias voltage Pbias and a second bias generator circuit 170 configured to generate the second variable bias voltage Nbias.

Figure 2C:
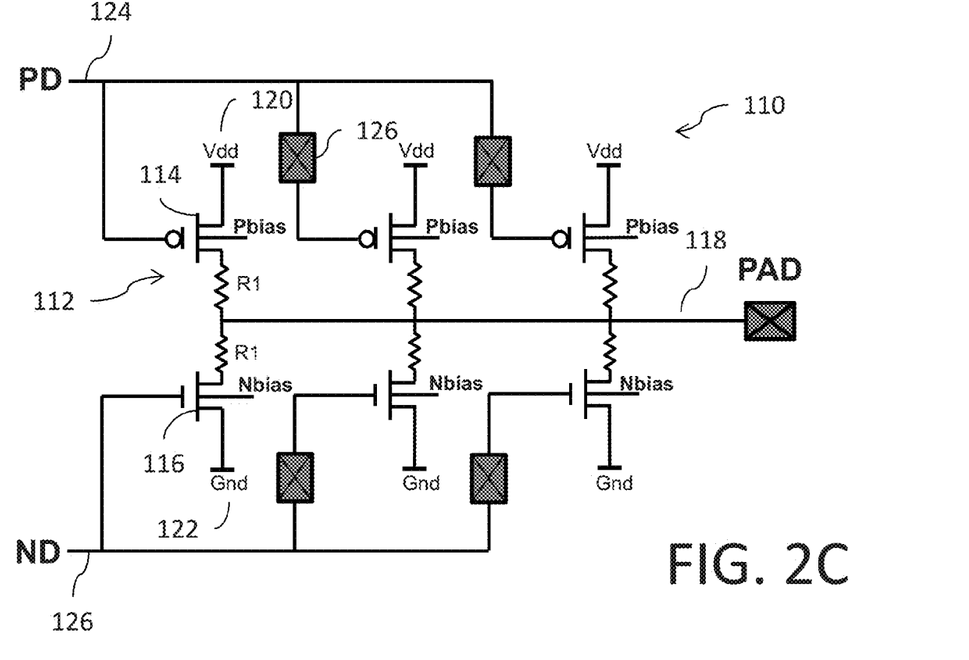
FIG. 2C is a circuit diagram of a driver circuit for the integrated circuit of FIG. 2A.

Reference is now made to FIG. 2C showing a circuit diagram for the driver circuit 110. The circuit of FIG. 2C differs from the circuit of FIG. 2B in the inclusion of a resistor R1 coupled in series with the source-drain path of each transistor 114 and 116. For example, a resistor R1 is provided between node 118 and the drain terminal of each transistor. These resistors R1 are provided to support impedance matching with respect to the load coupled to the circuit pad.

Figure 2D:
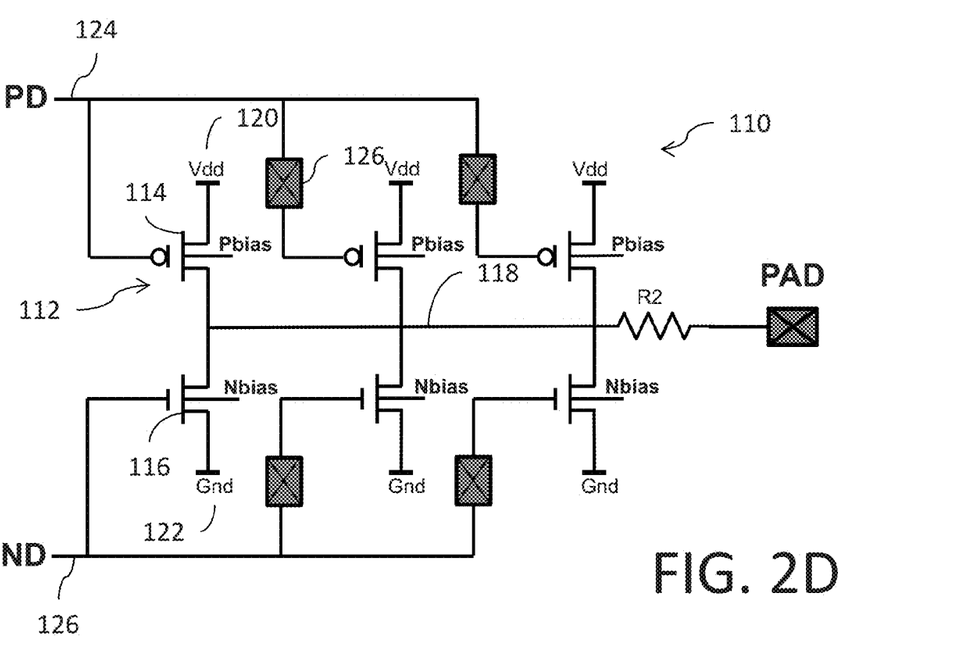
FIG. 2D is a circuit diagram of a driver circuit for the integrated circuit of FIG. 2A.

Reference is now made to FIG. 2D showing a circuit diagram for the driver circuit 110. The circuit of FIG. 2D differs from the circuit of FIG. 2B in the inclusion of a resistor R2 coupled in series between the node 118 and the circuit output pad. The resistor R2 is provided to support impedance matching with respect to the load coupled to the circuit pad.

Figure 3:
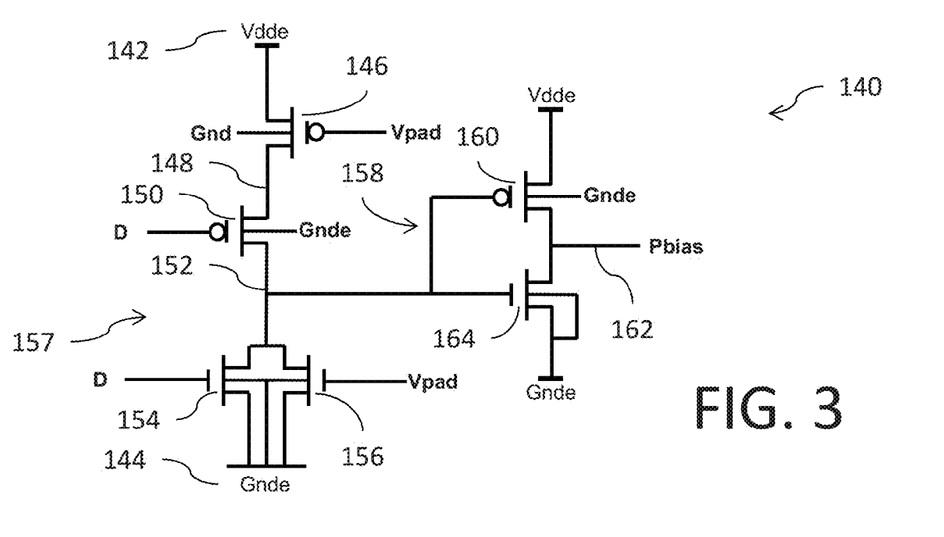
FIG. 3 is a circuit diagram for a first bias generator circuit configured to generate a first variable bias voltage.

Reference is now made to FIG. 3 showing a circuit diagram for the first bias generator circuit 140 configured to generate the first variable bias voltage Pbias. The circuit 140 is powered from the second power supply domain (for example, Vdde and Gnde) at nodes 142 and 144. The first variable bias voltage Pbias is generated as a function of the data signal D as well as the voltage at the integrated circuit pad (Vpad).

The circuit 140 includes a transistor 146 (p-channel MOSFET) having a source terminal coupled to node 142 (Vdde) and a drain terminal coupled to node 148. The gate terminal of transistor 146 is configured to receive the voltage Vpad. The body terminal of transistor 146 is coupled to node 144 (Gnde). The circuit 140 also includes a transistor 150 (p-channel MOSFET) having a source terminal coupled to node 148 and a drain terminal coupled to node 152. The gate terminal of transistor 150 is configured to receive the data signal D. The body terminal of transistor 150 is coupled to node 144 (Gnde). The circuit 140 further includes a transistor 154 (n-channel MOSFET) having a drain terminal coupled to node 152 and a source terminal coupled to node 144. The gate terminal of transistor 154 is configured to receive the data signal D. The body terminal of transistor 154 is coupled to the node 144. The circuit 140 still further includes a transistor 156 (n-channel MOSFET) having a drain terminal coupled to node 152 and a source terminal coupled to node 144. The gate terminal of transistor 156 is configured to receive the drive output signal at node 118 (V118). The body terminal of transistor 156 is coupled to the node 144. This circuitry is configured as a two-input logic-NOR gate 157 with inputs receiving signals D and Vpad and an output generating the signal at node 152.

The circuit 140 also includes a CMOS inverter circuit 158 (logic-NOT gate) including a transistor 160 (p-channel MOSFET) coupled at node 162 in series with a transistor 164 (n-channel MOSFET) between the node 142 and the node 144. The gate terminals of the transistors 160 and 164 are coupled to node 152. The first variable bias voltage Pbias is output at node 162.

Figure 4:
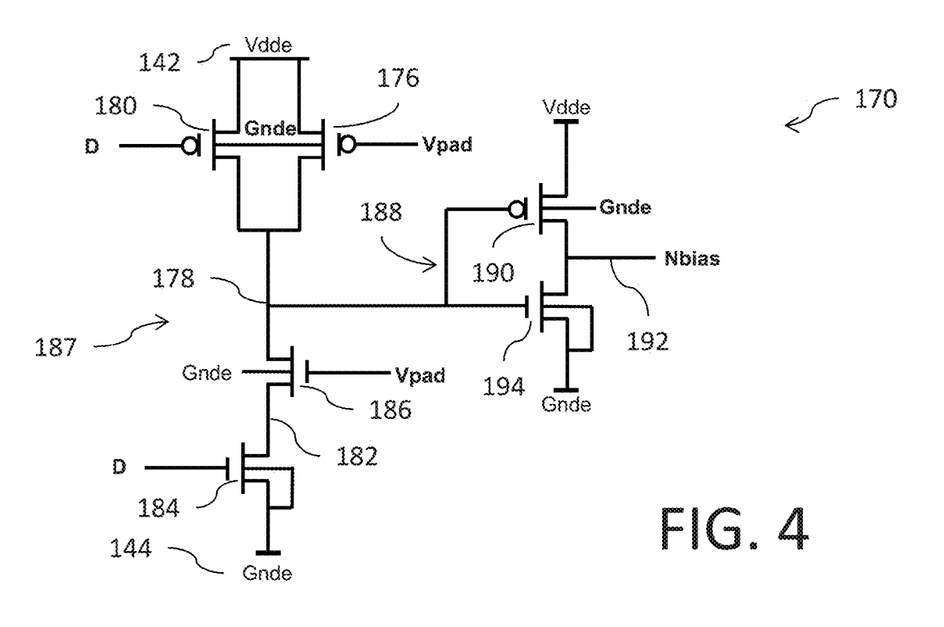
FIG. 4 is a circuit diagram for a second bias generator circuit configured to generate a second variable bias voltage.

Reference is now made to FIG. 4 showing a circuit diagram for the second bias generator circuit 170 configured to generate the second variable bias voltage Nbias. The circuit 170 is powered from the second power supply domain (for example, Vdde and Gnde) at nodes 142 and 144. The second variable bias voltage Nbias is generated as a function of the data signal D as well as the voltage at the integrated circuit pad (Vpad).

The circuit 170 includes a transistor 176 (p-channel MOSFET) having a source terminal coupled to node 142 and a drain terminal coupled to node 178. The gate terminal of transistor 176 is configured to receive the pad voltage Vpad. The body terminal of transistor 176 is coupled to node 144 (Gnde). The circuit 170 also includes a transistor 180 (p-channel MOSFET) having a source terminal coupled to node 142 and a drain terminal coupled to node 178. The gate terminal of transistor 180 is configured to receive the data signal D. The body terminal of transistor 180 is coupled to node 144. The circuit 170 further includes a transistor 184 (n-channel MOSFET) having a drain terminal coupled to node 182 and a source terminal coupled to node 144. The gate terminal of transistor 184 is configured to receive the data signal D. The body terminal of transistor 184 is coupled to the node 144. The circuit 170 still further includes a transistor 186 (n-channel MOSFET) having a source terminal coupled to node 182 and a drain terminal coupled to node 178. The gate terminal of transistor 186 is configured to receive the pad voltage Vpad. The body terminal of transistor 156 is coupled to the node 144. This circuitry is configured as a two-input logic-NAND gate 187 with inputs receiving signals D and Vpad and an output generating the signal at node 178.

The circuit 170 also includes a CMOS inverter circuit 188 (logic-NOT gate) including a transistor 190 (p-channel MOSFET) coupled at node 192 in series with a transistor 194 (n-channel MOSFET) between the node 142 and the node 144. The gate terminals of the transistors 190 and 194 are coupled to node 192. The second variable bias voltage Nbias is output at node 192.

Figure 5:
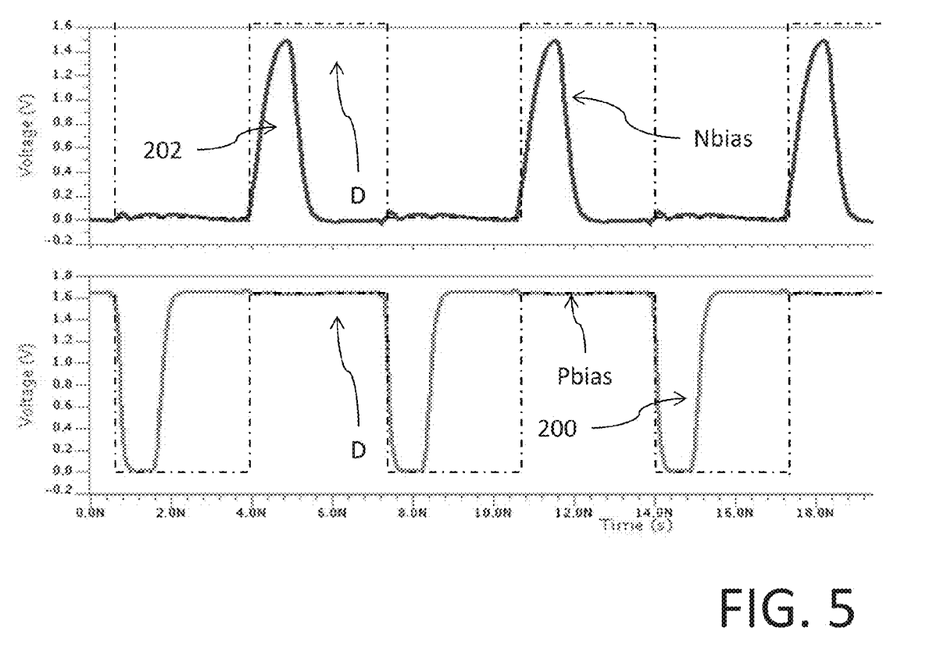
FIG. 5 is a waveform diagram for the generated body bias voltages.

Reference is now made to FIG. 5 showing waveforms for the first variable bias voltage Pbias generated at node 162 (by the first bias generator circuit 140) and the second variable bias voltage Nbias generated at node 192 (by the second bias generator circuit 170).

The first bias generator circuit 140 is operable to output a negative pulse 200 for signal Pbias that is generally coincident with each negative edge transition of the data signal D (wherein the general timing, but not necessarily the scale, of the data signal D is illustrated). In other words, when the data signal D transitions to low, the first bias generator circuit 140 generates a low voltage (negative pulse 200) applied as Pbias to the body of each of the transistors 114. With a low voltage applied to both the gate terminal and body, the transistors 114 will change state more quickly when driving the output at node 118 high. The negative pulse is initiated when the data signal D and the voltage at node 118 are low (so that transistors 146 and 150 both turn on). However, the voltage at node 118 shortly thereafter rises as the driver begins to change state causing transistor 146 to turn off and transistor 156 to turn on. This results in termination of the negative pulse 200.

The second bias generator circuit 170 is operable to output a positive pulse 202 generally coincident with each positive edge transition of the data signal D (wherein the general timing, but not necessarily the scale, of the data signal D is illustrated). In other words, when the data signal D transitions to high, the second bias generator circuit 170 generates a high voltage (positive pulse 202) applied as Nbias to the body of each of the transistors 116. With a high voltage applied to both the gate terminal and body, the transistors 116 will change state more quickly when driving the output at node 118 low. The positive pulse is initiated when the data signal D and the voltage signal at node 118 are high (so that transistors 184 and 186 both turn on). However, the voltage at node 118 shortly thereafter falls as the driver begins to change state causing transistor 176 to turn on and transistor 186 to turn off. This results in the termination of the positive pulse 202.

Figure 6:
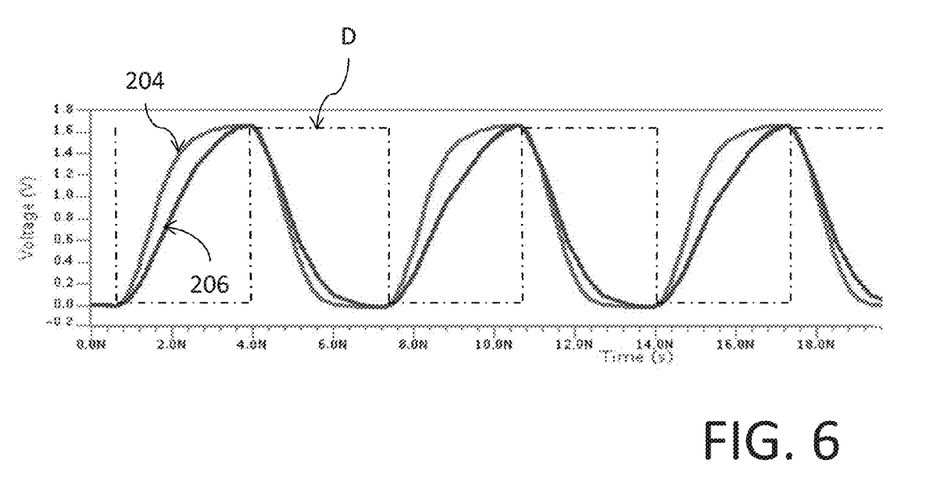
FIG. 6 is a waveform diagram comparing the output of the circuit of FIG. 2 to the output of the circuit of FIG. 1.
Figure 7:
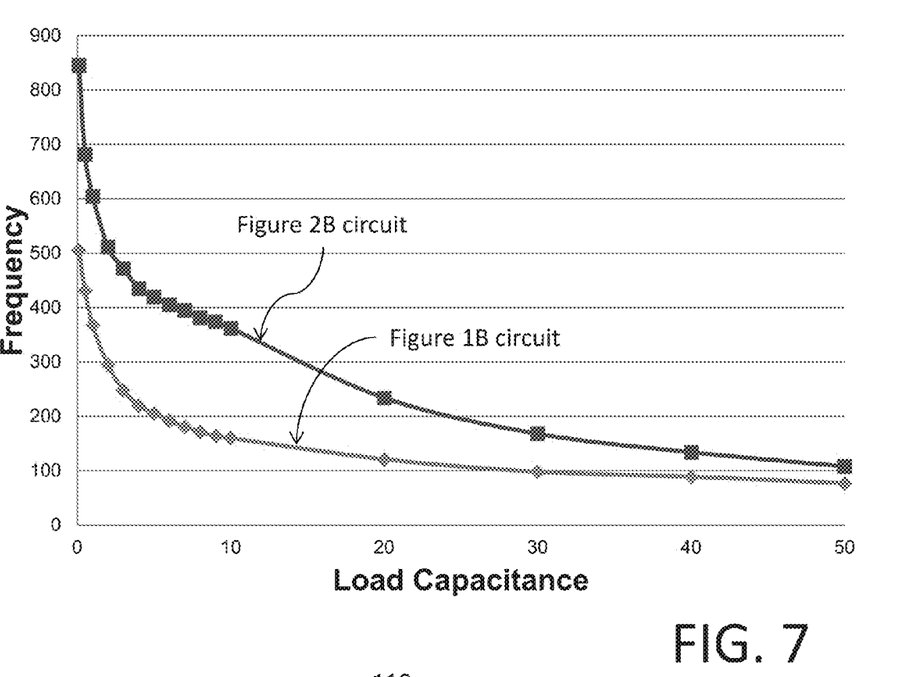
FIG. 7 is a diagram comparing frequency versus capacitance for the circuits of FIGS. 1 and 2.

Reference is now made to FIG. 6 showing waveforms for the output signal 204 generated by the driver circuit 110 of FIG. 2B at node 118 in comparison to the output signal 206 generated by the driver circuit 10 of FIG. 1B at node 18. The general timing, but not necessarily the scale, of the signal D is provided for reference. The positive effect on timing provided by varying the body bias of the transistors 114 and 116 is seen in FIG. 6 as the waveform for signal 204 transitions more quickly than the waveform for signal 206. Thus, an improvement in signal rise/fall time, for example of about 25%, is provided. Additionally, the driver 110 exhibits a decreased spread in duty cycle. Still further, an equivalent load capacitance can be driven at higher frequency without increase in leakage current as shown in FIG. 7.

It will be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
   a first drive transistor coupled between a first supply node and an output node, the first drive transistor having a first control terminal configured to receive a control signal from an input node, and further having a first body terminal;
   a second drive transistor coupled between a second supply node and said output node, the second drive transistor having a second control terminal configured to receive said control signal, and further having a second body terminal; and
   a body bias generator circuit comprising a logic circuit with power supply terminals connected to said first and second supply nodes and having inputs coupled to the input node and output node and outputs configured to apply a first body bias voltage to said first body terminal and a second body bias voltage to said second body terminal;
   wherein said first and second body bias voltages vary as a function of said control signal and a voltage at said output node.

2. The circuit of claim 1, wherein said logic circuit of the body bias generator circuit is configured, responsive to a first state transition of said control signal, to apply a negative pulse at a voltage level of the second supply node as said first body bias voltage to said first body terminal.

3. The circuit of claim 2, wherein said logic circuit of the body bias generator circuit is further configured, responsive to a second state transition of said control signal, to apply a positive pulse at a voltage level of the first supply node as said second body bias voltage to said second body terminal.

4. The circuit of claim 1, wherein said logic circuit of the body bias generator circuit is configured, responsive to a first state transition of said control signal, to apply a first pulse at a voltage level of the second supply node as said first body bias voltage to said first body terminal, and responsive to a second, opposite, state transition of said control signal, to apply a second pulse at a voltage level of the first supply node as said second body bias voltage to said second body terminal.

5. The circuit of claim 4, wherein said first pulse is a negative pulse and said second pulse is a positive pulse.

6. The circuit of claim 4, wherein a duration of each first and second pulse is limited by a time for said voltage at said output node to change state.

7. The circuit of claim 4, wherein a duration of each first and second pulse is limited by a time for change of said voltage at said output node to exceed a threshold voltage of at least one of said first and second transistors.

8. A circuit, comprising:
   a first drive transistor coupled between a first supply node and an output node, the first drive transistor having a first control terminal configured to receive a control signal, and further having a first body terminal;
   a second drive transistor coupled between a second supply node and said output node, the second drive transistor having a second control terminal configured to receive said control signal, and further having a second body terminal; and
   a body bias generator circuit configured to apply a first body bias voltage to said first body terminal and a second body bias voltage to said second body terminal;
   wherein said first and second body bias voltages vary as a function of said control signal and a voltage at said output node;
   wherein said body bias generator circuit comprises:
      a logic-NOR gate having a first input configured to receive said control signal and a second input configured to receive said voltage at said output node; and
      an inverter having an input coupled to an output of the logic-NOR gate and an output configured to generate said first body bias voltage.

9. A circuit, comprising:
   a first drive transistor coupled between a first supply node and an output node, the first drive transistor having a first control terminal configured to receive a control signal, and further having a first body terminal;
   a second drive transistor coupled between a second supply node and said output node, the second drive transistor having a second control terminal configured to receive said control signal, and further having a second body terminal; and
   a body bias generator circuit configured to apply a first body bias voltage to said first body terminal and a second body bias voltage to said second body terminal;
   wherein said first and second body bias voltages vary as a function of said control signal and a voltage at said output node;
   wherein said body bias generator circuit comprises:
      a logic-NAND gate having a first input configured to receive said control signal and a second input configured to receive said voltage at said output node; and
      an inverter having an input coupled to an output of the logic-NAND gate and an output configured to generate said second body bias voltage.

10. The circuit of claim 1, wherein said first and second transistors comprise a pair of CMOS transistors.

11. The circuit of claim 10, wherein said pair of CMOS transistors is implemented on a fully-depleted silicon on insulator (FD-SOI) substrate.

12. The circuit of claim 11, wherein said FD-SOI substrate includes a semiconductor layer, a substrate layer and an intervening insulator layer, wherein source and drain regions of said first and second transistors are implemented in said semiconductor layer, and wherein said first and second body terminals are implemented in said substrate layer.

13. The circuit of claim 1, wherein the logic circuit comprises a NOR gate circuit having input terminals coupled to the input node and output node.

14. The circuit of claim 1, wherein the logic circuit comprises a NAND gate circuit having input terminals coupled to the input node and output node.

15. A method, comprising:
  driving a control terminal of a first transistor coupled to an output pad with a control signal;
  driving a control terminal of a second transistor coupled to said output pad with said control signal;
  applying a first body bias voltage to a first body terminal of said first transistor, wherein said first body bias voltage varies over time in response to said control signal and a voltage at said output pad and wherein applying said first body bias voltage comprises first logically combining said control signal and the signal at said output node to generate the first body bias voltage; and
  applying a second body bias voltage to a second body terminal of said second transistor, wherein said second body bias voltage varies over time in response to said control signal and said voltage at said output pad and wherein applying said second body bias voltage comprises second logically combining said control signal and the signal at said output node to generate the second body bias voltage.

16. The method of claim 15, wherein applying the first body bias voltage comprises applying a negative pulse to vary said first body bias voltage in response to a first logic transition of said control signal.

17. The method of claim 16, wherein applying further comprises terminating said negative pulse in response to a change in state of said voltage at said output pad.

18. The method of claim 16, wherein applying further comprises terminating said negative pulse in response to a change in said voltage at said output pad in excess of a threshold voltage of at least one of said first and second transistors.

19. The method of claim 15, wherein applying the second body bias voltage comprises applying a positive pulse to vary said second body bias voltage in response to a second logic transition of said control signal.

20. The method of claim 19, wherein applying further comprises terminating said positive pulse in response to a change in state of said voltage at said output pad.

21. The method of claim 19, wherein applying further comprises terminating said positive pulse in response to a change in said voltage at said pad in excess of a threshold voltage of at least one of said first and second transistors.

22. The method of claim 15, wherein first logically combining comprises logically NOR-ing and second logically combining comprises logically NAND-ing.

* * * * *